(12) United States Patent  (10) Patent No.: US 9,111,973 B2
Zhao  (45) Date of Patent: Aug. 18, 2015

(54) ELASTIC RETENTION WHEELS AND WAFER ADAPTER CONTAINING THE SAME WHEELS

(71) Applicants: Semiconductor Manufacturing International (Shanghai) Corporation, Shanghai (CN); Semiconductor Manufacturing International (Beijing) Corporation, Beijing (CN)

(72) Inventor: Yujie Zhao, Shanghai (CN)

(73) Assignees: SEMICONDUCTOR MANUFACTURING INTERNATIONAL CORPORATION (SHANGHAI) (CN); SEMICONDUCTOR MANUFACTURING INTERNATIONAL CORPORATION (BEIJING) (CN)

( * ) Notice: Subject to any disclaimer, the term of this patent is extended or adjusted under 35 U.S.C. 154(b) by 225 days.

(21) Appl. No.: 13/622,869

(22) Filed: Sep. 19, 2012

(65) Prior Publication Data

US 2013/0082015 A1  Apr. 4, 2013

(30) Foreign Application Priority Data

Sep. 29, 2011 (CN) .......................... 2011 1 0301433

(51) Int. Cl.
*H01L 21/673* (2006.01)
*H01L 21/683* (2006.01)

(52) U.S. Cl.
CPC .... *H01L 21/67383* (2013.01); *H01L 21/67386* (2013.01)

(58) Field of Classification Search
CPC .................. H01L 21/67369; H01L 21/67383; H01L 21/67386; H01L 21/67303; H01L 21/67309; H01L 21/6732
USPC .............. 211/41.18, 41.12, 41.1; 414/416.08; 432/258; 206/832, 833, 710, 711
See application file for complete search history.

(56) References Cited

U.S. PATENT DOCUMENTS

| 2,201,989 | A | * | 5/1940 | Davis | 432/258 |
| 2,231,033 | A | * | 2/1941 | Smith | 432/258 |
| 2,233,434 | A | * | 3/1941 | Smith | 432/258 |
| 4,536,153 | A | * | 8/1985 | Anthony | 432/258 |
| 6,454,866 | B1 | * | 9/2002 | Halpin et al. | 118/730 |
| 6,578,853 | B1 | * | 6/2003 | Treur et al. | 279/121 |
| 7,121,414 | B2 | * | 10/2006 | Beckhart et al. | 211/41.18 |

(Continued)

FOREIGN PATENT DOCUMENTS

CN  201086933 Y  7/2008

*Primary Examiner* — Stanton L Krycinski
(74) *Attorney, Agent, or Firm* — Innovation Counsel LLP

(57) ABSTRACT

An elastic retention wheel and a wafer adapter containing this wheel are disclosed. The elastic retention wheel comprises: a rim; a retention main body positioned within the rim; and a plurality of spokes. Each spoke is positioned in a space between the rim and the retention main body. One end of each spoke is coupled to the retention main body, and the other end is coupled to the rim. A sliding rail can be provided on an inner side of the rim, and the spoke's other end can slide with the sliding rail. When the elastic retention wheel is stressed by a non-uniform or excessive external force, these spokes provide enhanced support from the rim's inner side, or at least partially disperse the non-uniform external force applied to the elastic retention wheel. Thereby, the elastic retention wheel is largely kept from over-deformation or cracking.

13 Claims, 4 Drawing Sheets

(56) References Cited

U.S. PATENT DOCUMENTS

| | | | |
|---|---|---|---|
| 7,578,392 B2 * | 8/2009 | Brooks et al. | 206/710 |
| 7,655,093 B2 * | 2/2010 | Halpin et al. | 118/728 |
| 7,658,290 B2 * | 2/2010 | Sumi et al. | 206/710 |
| 7,866,480 B2 * | 1/2011 | Burns et al. | 206/711 |
| 8,091,710 B2 * | 1/2012 | Hasegawa et al. | 206/711 |
| 8,393,471 B2 * | 3/2013 | Ochoa et al. | 206/710 |
| 2003/0121870 A1 * | 7/2003 | Beckhart et al. | 211/41.18 |
| 2005/0173358 A1 * | 8/2005 | Oyama | 211/41.18 |
| 2008/0185315 A9 * | 8/2008 | Brooks et al. | 206/710 |
| 2009/0260329 A1 * | 10/2009 | Ochoa et al. | 53/473 |
| 2009/0266441 A1 * | 10/2009 | Sato | 141/63 |
| 2011/0005967 A1 * | 1/2011 | Gregerson et al. | 206/711 |

* cited by examiner

ELASTIC RETENTION WHEELS AND WAFER ADAPTER CONTAINING THE SAME WHEELS

CROSS-REFERENCE TO RELATED APPLICATIONS

This application claims priority to Chinese Patent Application No. CN201110301433.7, filed on Sep. 29, 2011 and entitled "Elastic Retention Wheels and Wafer Adapter Containing the Same Wheels", which is incorporated herein by reference in its entirety.

BACKGROUND

1. Field of the Invention

Embodiments of the present invention relate generally to semiconductor device manufacturing, and more particularly, to a wafer adapter for use in manufacturing of semiconductor devices.

2. Description of the Related Art

The semiconductor device manufacturing industry has sought continuous increases in wafer size, in order to reduce semiconductor device cost. As is well known, the larger the wafer size is, the more dies can be produced from a single wafer, and thus the lower the cost of an individual die.

However, moving to a larger size wafer typically requires high equipment cost. Furthermore, it is common for semiconductor device manufacturers to produce chips on wafers of two or more different sizes in the same factory. Thus, these factories are required to provide compatibility for wafers of different sizes.

During manufacturing of semiconductor devices, wafers pass through various sophisticated processing steps implemented in different devices to be made into semiconductor dies. In order to simplify transportation and reduce contamination, a Front Opening Unified Pod (FOUP) is usually adopted to transfer wafers from equipment to equipment. Multiple wafers are often accommodated in a FOUP, and the FOUP carrying wafers can be moved to the front of a processing equipment, where wafers are loaded into the processing equipment for processing, and later returned to the FOUP when the process is complete. The FOUP is then transferred to the next processing equipment.

A FOUP is made for accommodating the current largest wafers. A wafer adapter can be used to allow such FOUPs to also carry wafers of smaller size. FIG. 1 schematically illustrates the structure of a conventional FOUP provided with a wafer adapter. As shown in FIG. 1, a wafer adapter 102 capable of carrying wafers of small size is placed in a FOUP 100 suitable for wafers of large size. Wafer adapter 102 is secured in place within FOUP 100 by the force produced by elastic retention wheels 104 against the inner walls of the FOUP.

However, existing elastic retention wheels 104 are prone to crack due to non-uniform force exertion. For example, when elastic retention wheel 104 receives an excessive pressing force, rim 106 of elastic retention wheel 104 may be overly deformed, causing the rim 106 to crack. The cracked edges of elastic retention wheel 104 may easily scratch or even break wafers placed in wafer adapter 102. Also, wafer adapter 102 cannot be stably secured in FOUP 100, which may further cause wafer breakage, contaminating the production or metrology equipment as a result.

SUMMARY

In the present disclosure, through supplying spokes between the retention main body and rim of an elastic retention wheel for a wafer adapter, an enhanced supporting force is provided for the elastic retention wheel, thus diminishing or eliminating the occurrence of wheel crash.

According to a first aspect of the present disclosure, there is provided an elastic retention wheel adapted for use in a wafer adapter, the elastic retention wheel comprising: a rim; a retention main body, the retention main body being positioned within the rim and integrally formed with the rim, the retention main body and at least a portion of the rim being separated from each other by a space; and a plurality of spokes, each spoke positioned within the space, each spoke further having a first end coupled to the retention main body and a second end coupled to the rim.

In one embodiment, the rim further includes a first sliding rail slidably provided on an inner side of the rim, the inner side of the rim facing the main body, and wherein the second end of each spoke is movable with the sliding rail.

In one embodiment, the first end of each spoke is affixed to the retention main body.

In one embodiment, a second sliding rail is slidably provided along a perimeter of the retention main body, and the first end of each spoke is movable with the second sliding rail.

In one embodiment, the second end of each spoke is affixed to the rim. In one embodiment, the first end of each spoke is affixed to the retention main body.

In one embodiment, the first sliding rail further comprises a plurality of sliding rail segments separated from each other and slidably coupled to the rim, wherein the second end of each spoke is movable with a respective sliding rail segment.

In one embodiment, the second sliding rail further comprises a plurality of retention main body slide rail segments separated from each other and slidably coupled to the retention main body, wherein the first end of each spoke is movable with a respective second sliding rail segment.

In one embodiment, the spokes are symmetrically disposed around the retention main body.

In one embodiment, one spoke is disposed to be collinear with a central axis of the retention main body, and other spokes are symmetrically disposed with respect to the collinear spoke.

In one embodiment, some or all of the plurality of spokes are disposed in a portion of the space.

In one embodiment, the spokes each comprise a same material as that of the rim and the retention main body.

In one embodiment, the spokes comprise a plastic.

In one embodiment, the retention main body has a screw hole for affixing the elastic retention wheel to a wafer adapter.

In one embodiment, a total number of the spokes is three.

According to another aspect of the present invention, there is provided a wafer adapter comprising: an upper support; a lower support; a multi-tier wafer rack arranged between the upper and lower supports and configured for carrying wafers, and one or more elastic retention wheels mounted on an upper surface of the upper support and/or on an upper surface of the lower support. Each elastic retention wheel comprises a rim, a retention main body, and a plurality of spokes. The retention main body is positioned within the rim and integrally formed with the rim, the retention main body and at least a portion of the rim being separated from each other by a space. Each spoke is positioned within the space, each spoke further having a first end coupled to the retention main body and a second end coupled to the rim.

In the embodiment of this disclosure, through arranging spokes between the retention main body and rim of an elastic retention wheel used in a wafer adapter, an enhanced supporting force is provided to the rim from the inner side of the rim, preventing over-deformation of the rim and consequently eliminating or diminishing the occurrence of cracks in the elastic retention wheel.

The elastic retention wheel of the disclosed embodiment may have a slide rail disposed on the inner side of the rim, and the spokes can slide with the sliding rail. Allowing spokes to slide with the slide rail makes it possible to at least partially disperse the non-uniform force applied to the elastic retention wheel, thus further decreasing the occurrence of cracks in the elastic retention wheel.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

This invention can be more clearly understood from the following detailed description with reference to the accompanying drawings, wherein.

DESCRIPTION OF THE EMBODIMENTS

Figure 1:
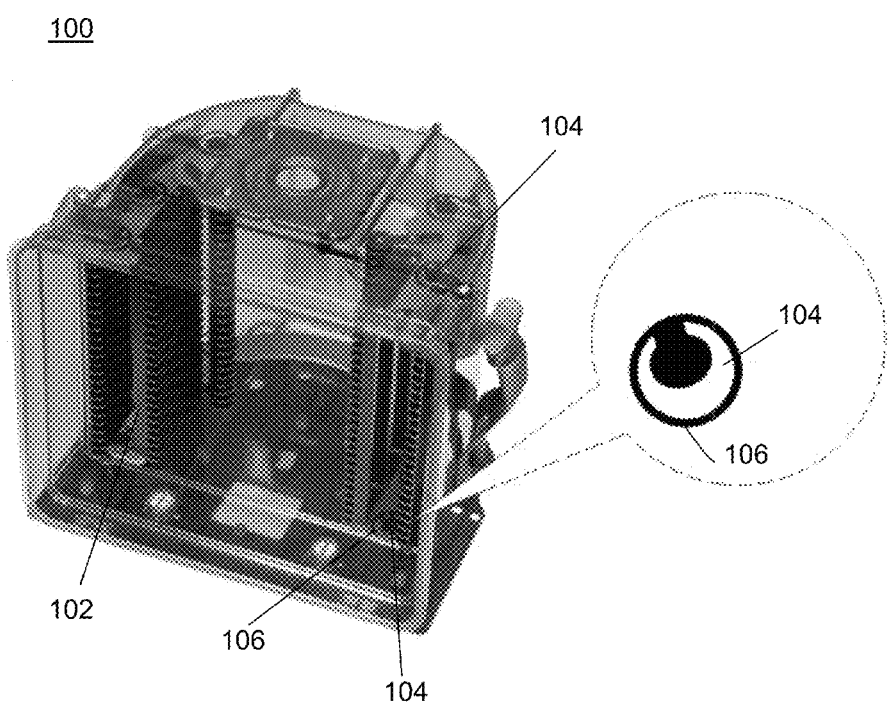
FIG. 1 is a diagram showing a conventional FOUP provided with a wafer adapter.

Various exemplary embodiments of the present disclosure will now be described in detail with reference to the drawings. It should be noted that the relative arrangement of the components and steps, the numerical expressions, and numerical values set forth in these embodiments do not limit the scope of the present disclosure unless it is specifically stated otherwise.

Meanwhile, it should be appreciated that those parts in the drawings are not shown to practical scale for the convenience of description.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

In order to diminish or eliminate elastic retention wheel cracking in a wafer adapter, it has been proposed to arrange spokes between the retention main body and rim of an elastic retention wheel, so as to provide enhanced support to the elastic retention wheel. Further, a sliding rail can be disposed on the inner side of the rim of the elastic retention wheel, and those spokes can be slidable within the sliding rail. By allowing the spokes to slide or rotate within the slide rail, a non-uniform force applied to the elastic retention wheel can be at least partially dispersed, so that the occurrence of the elastic retention wheel's cracks can be further diminished.

Below, with reference to FIGS. 2A to 2C, the structure of an elastic retention wheel 200 used in a wafer adapter according to one embodiment of this disclosure will be described.

Figure 2A:
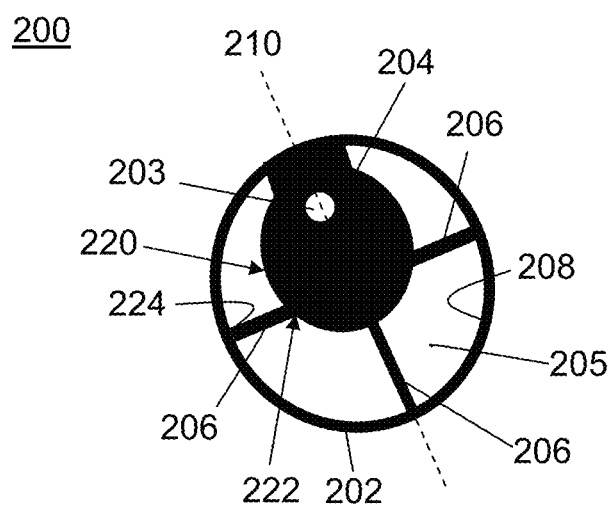
FIGS. 2A to 2C are diagrams illustrating an elastic retention wheel used in a wafer adapter according to disclosed embodiments.

As shown in FIG. 2A, elastic retention wheel 200 comprises a rim 202 and a retention main body 204. Retention main body 204 is positioned internally with respect to rim 202 (i.e. placed substantially entirely within rim 202), and can be formed together with rim 202. Retention main body 204 is separated from a portion of rim 202 by a space 205. As shown in the example of FIG. 2A, retention main body 204 has a substantially circular or elliptical shape. However, retention main body 204 may have any other suitable shape or shapes. For the convenience of fabrication, retention main body 204 is shown here as having a symmetric form with a central symmetric axis 210, although again any other shape is contemplated.

In one embodiment, retention main body 204 is provided with screw holes 203 for fixing elastic retention wheel 200 on the wafer adapter. In other embodiments, elastic retention wheel 200 can be affixed to the wafer adapter through one of any other known fixing methods.

Elastic retention wheel 200 further comprises at least two spokes 206 positioned in the space 205 (in FIG. 2A, three are shown). As shown in FIG. 2A, one end 222 of each spoke 206 contacts or is connected to retention main body 204. For example, end 222 of spoke 206 can be affixed to retention main body 204, and more specifically can be affixed to a perimeter 220 of retention main body 204. Alternatively, spoke 206 can be constructed integrally with retention main body 204. The other end 224 of each spoke 206 contacts, or is connected to, the inner side of rim 202. Spoke 206 can be made of the same material as that of rim 202 and retention main body 204, for example, plastic such as a rigid injection molded plastic, and/or metal.

When a wafer adapter containing the above elastic retention wheel 200 is placed into the FOUP 100 of FIG. 1, rim 202 of elastic retention wheel 200 may receive a pressing force from the inner wall of FOUP 100 and be deformed as a result. Because spoke 206 has its one end 222 attached to retention main body 204, and the other end 224 contacts the inner side of rim 202, spoke 206 may support rim 202 from the inner side of rim 202, so that over-deformation of rim 202 can be prevented, thus diminishing the occurrence of crack of elastic retention wheel 200. Further, the problem of unstable fixing of the wafer adapter due to cracks in the elastic retention wheel can be prevented. This has a number of beneficial effects, including avoiding cracked pieces of retention wheel 200 from scratching or breaking wafers placed in the wafer adapter, or contaminating the wafer and/or production or metrology equipment, as well as preventing contamination of production or metrology equipment from the broken wafer itself.

In embodiment 1, end 224 of spoke 206 can be affixed to the inner side of rim 202. In embodiment 2, a sliding rail 208 is provided on the inner side of rim 202, and end 224 of each spoke 206 can slide along with the sliding rail 208 inside rim 202. That is, the end 224 of spoke 206 can be affixed to a sliding rail 208 that is slidably coupled to the inside of the rim 202, allowing the end 224 of the spoke 206 to slide along rim 202.

When extrusion deformation occurs at rim 202 of elastic retention wheel 200 under an external force, end 224 of spoke 206 placed in sliding rail 208 will slide towards both sides of the point where the external force is applied. Elastic deformation may occur at the stressed point on rim 202 of elastic retention wheel 200. After a restricted slide of spoke 206 in sliding rail 208, spoke 206 is constrained to be fixed in sliding rail 208, preventing or reducing the deformation of rim 202 of elastic retention wheel 200, and preventing the elastic retention wheel from over-deformation so as to crack due to lack of an internal counterforce against the non-uniform external force applied to the elastic retention wheel.

Note that although spoke 206 is described to have its one end 222 fixed to retention main body 204 in the above embodiment 1, in embodiment 2, a retention main body sliding rail (not shown) can be formed on retention main body 204 (for example, on perimeter 220 of retention main body 204), and end 222 of each spoke 206 can move along the retention main body sliding rail. That is, the end 222 of one or more spokes 206 can be affixed to a sliding rail that is slidably coupled to the retention main body 204, allowing the end 222 of the spoke 206 to slide along the edge of the retention main body 204.

Figure 2B:
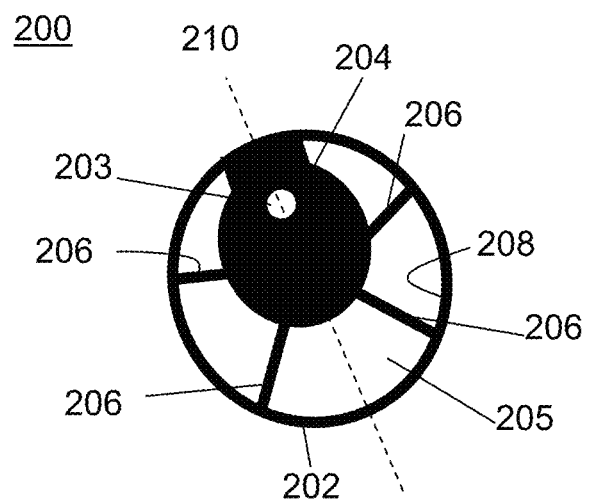
Figure 2C:
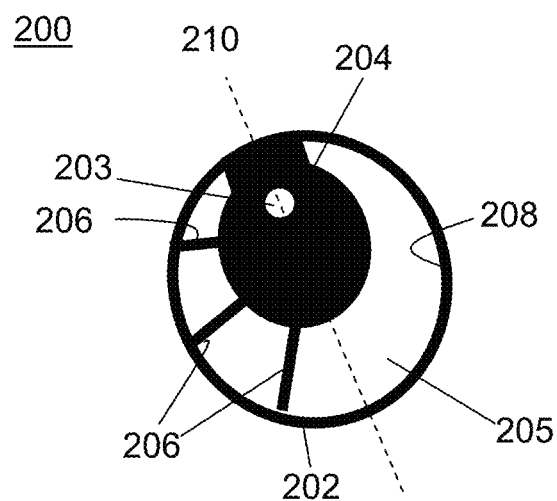

In addition, although FIGS. 2A to 2C show sliding rail 208 positioned along the inner side of the entire rim 202, in some embodiments, sliding rail 208 may be provided on the inner side of only a part of rim 202. For example, sliding rail 208 may consist of a plurality of sliding rail segments separated or spaced apart from each other. Each sliding rail segment then corresponds to one spoke 206. That is, end 224 of spoke 206 can only move within a corresponding sliding rail segment. Further, in the case of providing a retention main body sliding rail in retention main body 204, the retention main body sliding rail also may consist of a plurality of retention main body sliding rail segments, and the ends 222 of each spoke 206 can move within a corresponding retention main body sliding rail segment.

Spokes 206 of elastic retention wheel 200 can be approximately evenly disposed within the space 205 between retention main body 204 and rim 202. For example, each spoke 206 can be disposed in space 205 at equal angular intervals. In one embodiment, when the total number of spokes 206 is even, spokes 206 can be symmetrically disposed with respect to retention main body 204, as shown in FIG. 2B. In another embodiment, when the total number of spokes 206 is odd, one spoke 206 can be disposed to be collinear to central axis 210 of retention main body 204 (i.e. the axis passing through hole 203 and bisecting the main body 204), and other spokes 206 are symmetrically disposed with respect to the collinear spoke 206, as shown in FIG. 2A. As disclosed above, tips of these spokes may move inside the rim 202 to disperse any distortion-induced stress.

Some or all of the spokes 206 of elastic retention wheel 200 can be disposed in a portion of the space 205, as shown in FIG. 2C. That is, the spokes 206 can be unevenly distributed through space 205, such as all spokes 206 being positioned on one side of central axis 210 (FIG. 2C), or with a minority of spokes 206 on the other side of axis 210. As described above, spokes 206 of elastic retention wheel 200 have two functions. First, they support rim 202 from its inner side; and second, they act like a shock absorber by absorbing/dispersing any external force applied to elastic retention wheel 200 to prevent rim 202's over-deformation when the external force is non-uniform or excessive. Thus, retention wheel 200 has an appropriate elasticity to secure the wafer adapter to the FOUP, so that some or all of the spokes 206 can be disposed in the portion of the space 205 corresponding to the stressed portion of rim 202.

The total number of the spokes can be appropriately selected according to various criteria. For example, more spokes can be placed in highly stressed elastic retention wheels, to provide for more reinforcement as desired. On the other hand, the elasticity of elastic retention wheels may be impaired if there are too many spokes for securing the wafer adapter to the FOUP. That is, the retention wheels may be too stiff. A total number of three spokes has been found to work well in various applications. However, other numbers of spokes may also work well in different situations.

Elastic retention wheel 200 according to the disclosed embodiment shown in FIGS. 2A to 2C can be applied to various wafer adapters in semiconductor fabrication equipment. As shown below, the application of elastic retention wheel 200 will be further described with reference to FIG. 3, in an example of a wafer adapter used in a FOUP.

Figure 3:
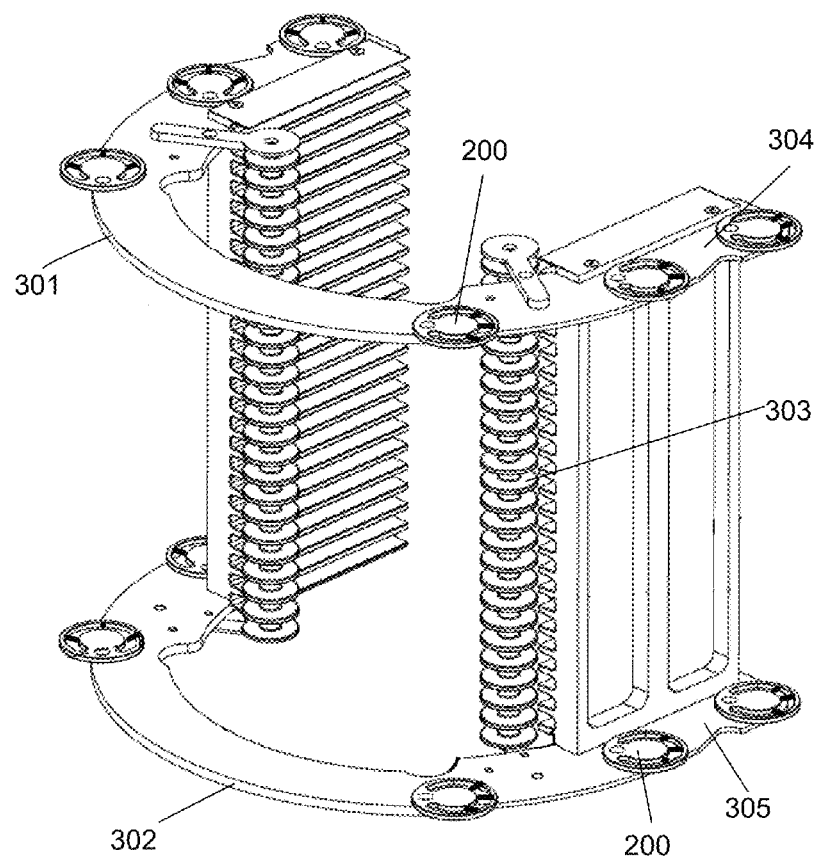
FIG. 3 is a diagram showing a wafer adapter containing the elastic retention wheel shown in FIGS. 2A to 2C according to the disclosed embodiments.

FIG. 3 schematically shows the structure of a wafer adapter 300 containing elastic retention wheel 200 shown in FIGS. 2A to 2C according to the embodiments of this disclosure. Wafer adapter 300 comprises: an upper support 301, a lower support 302 and a multi-tier wafer rack 303. The multi-tier wafer rack 303 is arranged between the upper support 301 and the lower support 302 for carrying wafers. Generally, a multi-tier wafer rack may have 25 wafers placed thereon at present, although they can be configured to carry any number of wafers.

Generally, one or more elastic retention wheels 200 according to the above embodiments can be mounted on upper surface 304 of the upper support 301 and/or on upper surface 305 of lower support 302. For example, screw holes can be provided on specific positions on upper surface 304 of upper support 301, or on upper surface 305 of lower support 302. One or more elastic retention wheels 200 can be mounted on upper support 301 and lower support 302 through their respective screw holes 203. As described above, elastic retention wheels 200 also can be mounted on wafer adapter 300 through any other suitable mounting method or methods.

Through arranging spokes between the retention main body and rim of the elastic retention wheel of a wafer adapter in the disclosed embodiment, an enhanced supporting force is provided to the rim from its inner side to prevent over-deformation of the rim, diminishing or eliminating the occurrence of cracks in the elastic retention wheel.

The elastic retention wheel according to the disclosed embodiment can be provided with a sliding rail on the inner side of the rim, and the spokes can slide in or with the sliding rail. Through enabling the spokes to slide in the slide rail, any non-uniform force applied on the elastic retention wheel can be at least partially dispersed, further diminishing the occurrence of cracks in an elastic retention wheel.

Thus, the apparatus and method of manufacture of embodiments of the present invention have been described in detail. Some specifics that are well known in the art are not provided in order not to obscure the ideas of the present invention. Those skilled in the art, according to the description above, will understand how to implement specifics of technical schemes disclosed herein.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the appended claims therefore should be accorded the broadest interpretation so as to encompass all such modifications and similar arrangements and procedures.

What is claimed is:

1. An elastic retention wheel adapted for use in a wafer adapter, the elastic retention wheel comprising:
   a rim;
   a retention main body, the retention main body being positioned within the rim and integrally formed with the rim, the retention main body and at least a portion of the rim being separated from each other by a space; and
   a plurality of spokes, each spoke positioned within the space, each spoke further having a first end coupled to the retention main body and a second end coupled to the rim;
   wherein the rim further includes a first sliding rail slidably provided on an inner side of the rim, the inner side of the rim facing the main body, and wherein the second end of each spoke is movable with the sliding rail.

2. The elastic retention wheel according to claim 1, wherein the first end of each spoke is affixed to the retention main body.

3. The elastic retention wheel according to claim 1, wherein a second sliding rail is slidably provided along a perimeter of the retention main body, and the first end of each spoke is movable with the second sliding rail.

4. The elastic retention wheel according to claim 1, wherein the spokes are symmetrically disposed around the retention main body.

5. The elastic retention wheel according to claim 1, wherein one of said plurality of spokes is disposed to be collinear with a central axis of the retention main body, and others of said plurality of spokes are symmetrically disposed with respect to the collinear spoke.

6. The elastic retention wheel according to claim 1, wherein some or all of the plurality of spokes are disposed in a portion of the space.

7. The elastic retention wheel according to claim 1, wherein the spokes each comprise a same material as that of the rim and the retention main body.

8. The elastic retention wheel according to claim 1, wherein the spokes comprise a plastic.

9. The elastic retention wheel according to claim 1, wherein the retention main body has a screw hole for affixing the elastic retention wheel to a wafer adapter.

10. The elastic retention wheel according to claim 1, wherein a total number of the spokes is three.

11. A wafer adapter, comprising:
    an upper support;
    a lower support;
    a multi-tier wafer rack arranged between the upper support and the lower support and configured for carrying wafers; and
    one or more elastic retention wheels mounted on an upper surface of the upper support, each elastic retention wheel comprising:
      a rim;
      a retention main body, the retention main body being positioned within the rim and integrally formed with the rim, the retention main body and at least a portion of the rim being separated from each other by a space; and
      a plurality of spokes, each spoke positioned within the space, each spoke further having a first end coupled to the retention main body and a second end coupled to the rim.

12. A wafer adapter, comprising:
    an upper support;
    a lower support; and
    a multi-tier wafer rack arranged between the upper support and the lower support and configured for carrying wafers; and
    one or more elastic retention wheels mounted on an upper surface of the lower support, each elastic retention wheel comprising:
      a rim;
      a retention main body, the retention main body being positioned within the rim and integrally formed with the rim, the retention main body and at least a portion of the rim being separated from each other by a space; and
      a plurality of spokes, each spoke positioned within the space, each spoke further having a first end coupled to the retention main body and a second end coupled to the rim.

13. A wafer adapter, comprising:
    an upper support;
    a lower support;
    a multi-tier wafer rack arranged between the upper support and the lower support and configured for carrying wafers; and
    a plurality of elastic retention wheels, each comprising:
      a rim;
      a retention main body, the retention main body being positioned within the rim and integrally formed with the rim, the retention main body and at least a portion of the rim being separated from each other by a space; and
      a plurality of spokes, each spoke positioned within the space, each spoke further having a first end coupled to the retention main body and a second end coupled to the rim;
    wherein one or more of the elastic retention wheels is mounted on an upper surface of the upper support; and
    wherein one or more of the elastic retention wheels is mounted on an upper surface of the lower support.

* * * * *